United States Patent
Bauer et al.

(10) Patent No.: US 7,304,553 B2
(45) Date of Patent: Dec. 4, 2007

(54) FILTER WITH ACOUSTICALLY COUPLED RESONATORS

(75) Inventors: Thomas Bauer, München (DE);
Ken-ya Hashimoto, Funabashi (JP);
Ulrike Roesler, Herbertshausen (DE);
Werner Ruile, München (DE); Veit Meister, Kagel (DE); Heide Kuhrau, München (DE); Michael Jakob, München (DE)

(73) Assignee: Epcos AG, Munich (DE)

( * ) Notice: Subject to any disclaimer, the term of this patent is extended or adjusted under 35 U.S.C. 154(b) by 179 days.

(21) Appl. No.: 10/508,979

(22) PCT Filed: Mar. 25, 2003

(86) PCT No.: PCT/DE03/00980

§ 371 (c)(1),
(2), (4) Date: May 23, 2005

(87) PCT Pub. No.: WO03/081773

PCT Pub. Date: Feb. 10, 2003

(65) Prior Publication Data
US 2005/0212620 A1    Sep. 29, 2005

(30) Foreign Application Priority Data
Mar. 25, 2002  (DE) ................ 102 13 277

(51) Int. Cl.
*H03H 9/64*    (2006.01)
(52) U.S. Cl. ..................... 333/193; 333/195
(58) Field of Classification Search ........... 333/193, 333/195

See application file for complete search history.

(56) References Cited

U.S. PATENT DOCUMENTS

| 3,970,970 | A | * | 7/1976 | Worley ................ 333/195 |
| 5,486,800 | A | | 1/1996 | Davenport |
| 5,499,003 | A | | 3/1996 | Davenport |
| 5,682,126 | A | * | 10/1997 | Plesski et al. ............ 333/193 |
| 6,172,580 | B1 | * | 1/2001 | Taniguchi et al. ......... 333/193 |
| 6,420,946 | B1 | | 7/2002 | Bauer et al. |
| 2003/0122449 | A1 | | 7/2003 | Bergmann |

FOREIGN PATENT DOCUMENTS

| DE | 198 18 038 | 11/1999 |
| EP | 0 718 970 | 6/1996 |
| EP | 0 750 394 | 12/1996 |
| EP | 0 772 293 | 5/1997 |
| EP | 1 246 359 | 10/2002 |

(Continued)

OTHER PUBLICATIONS

Ruppel et al, "SAW Devices for Consumer Communication Applications", *IEEE Transactions on Ultrasonics, Ferroelectrics and Frequency Control*, vol. 40, No. 5, Sep. 1993, pp. 438-452.

*Primary Examiner*—Barbara Summons
(74) *Attorney, Agent, or Firm*—Schiff Hardin LLP

(57) ABSTRACT

A component operating with surface-proximal acoustic waves, in particular a filter with novel structure, has interdigital transducers arranged in serial and parallel branches, which are acoustically coupled with one another in different configurations. The component provides a loss-poor filter with simultaneously space-saving arrangement of the filter elements.

40 Claims, 8 Drawing Sheets

| FOREIGN PATENT DOCUMENTS | | | | JP | 10-242799 | * | 9/1998 |
|---|---|---|---|---|---|---|---|
| EP | 1 280 274 | | 1/2003 | WO | WO 00/25423 | | 5/2000 |
| JP | 3-201613 | * | 9/1991 ........ 333/193 | WO | WO 01/65687 | | 9/2001 |
| JP | 9-8598 | | 1/1997 | | | | |

* cited by examiner

FILTER WITH ACOUSTICALLY COUPLED RESONATORS

BACKGROUND OF THE INVENTION

The invention concerns a component working with surface-proximal acoustic waves, in particular a filter with a network structure, in which component resonators are embedded.

Today, SAW, or surface acoustical wave, filters are predominantly used as bandpass filters in the RF range in the front end of end apparatuses of mobile communication, for example in mobile telephones. These are significantly fashioned as reactance or DMS filters.

Circuits of DMS filters with reactance elements are also known, in particular with one-port resonators executed in SAW technology. Thus, for example, a DMS filter is known from DE 198 18 038 A in which two DMS filters circuited in serial or in parallel are circuited in series with reactance elements on the input or output side. Moreover, it is proposed there to arrange both DMS filters inside an acoustic track and two adjacent DMS filters are to be divided via intermediate reflectors.

Further known filters are also two-port resonators that, however, can only seldom be used in the RF range due to their narrowband transmission characteristics.

Depending on the desired characteristic profile, one of the technologies can be preferable. For example, with closely adjacent frequency bands for selection, higher demands are made on the skirt steepness of those passband edges that are close to the respectively adjacent frequency band. Different skirts can favor different technologies. Reactance filters are additionally characterized by higher power stability. A desired demanding characteristic profile for an RF filter, in particular for a new transmission technology, can often no longer be realized with known, "pure" technologies. Thus, for example with reactance filters, an unwanted "ripple" occurs in the transmission range that is based on the finite length of the series resonator. Likewise, the insertion attenuation is increased based on the finite length of the resonators used in reactance filters.

From U.S. Pat. No. 5,486,800 C1 it is known to serially arrange a plurality of identical interdigital transducers directly adjacent to one another within only one acoustic track such that an acoustic coupling of the interdigital transducers ensues. The interdigital transducers are electrically connected in series, whereby a parallel branch connected to ground respectively branches off between two interdigital transducers. In the type of ladder-type structure, a further parallel interdigital transducer is arranged in every parallel branch. A plurality of parallel interdigital transducers can also be arranged within an acoustic track and likewise be acoustically coupled. Each track with acoustically coupled interdigital transducers can be bordered on both sides by one acoustic reflector.

SUMMARY OF THE INVENTION

It is therefore the object of the present invention to specify new structures for components operating with surface-proximal acoustic waves with which filters can be obtained with further improved characteristics.

This object is inventively achieved with a component with the following features:

at least three interdigital transducers are arranged on the surface of a piezoelectric substrate, said interdigital transducers being respectively provided with a first and a second electrical connection and being electrically circuited with one another via these connections, whereby the interdigital transducers are selected from serial and parallel interdigital transducers, at least one serial interdigital transducer is arranged in at least one serial branch serving as a signal path, said branch connecting the input and the output of the component and in which all elements contained therein are electrically connected in series, at least one parallel branch in which is arranged a parallel interdigital transducer is connected parallel thereto opposite a reference potential, at least one of the serial or parallel interdigital transducers is arranged in series with a further interdigital transducer in the propagation direction of the acoustic wave, such that both interdigital transducers are acoustically coupled with one another, whereby the transducers coupled with one another differ from one another by at least one of the following features:

a) the interdigital transducers possess a different aperture b) the interdigital transducers possess a different pitch c) the interdigital transducers belong to different branches of the component d) of the interdigital transducers, at least one is arranged in the serial branch and the transducers are not directly electrically connected with one another e) the interdigital transducers comprise a different number of interdigital electrode fingers f) the interdigital transducers exhibit a different metallization ratio g) the interdigital transducers are weighted and exhibit a different weighting.

With the invention, deviation is made from the strictly regular ladder-type structure known from U.S. Pat. No. 5,486,800 and the symmetry is deliberately disturbed in order to achieve further advantageous effects. While the known ladder-type structure obeyed a wave parameter design, an inventive component is based on an effective parameter design. It allows a completely novel filter structure that, in addition to many new characteristics, is primarily also characterized by a smaller space requirement (chip surface). In all exemplary embodiments, at least the regular branching of parallel branches and the requirement of the respective interdigital transducers designed identically in the serial or parallel branch are omitted. A filter behavior can therewith be designed that possesses arbitrarily many pole locations, thus shows gating behavior at arbitrary frequencies and overall exhibits an improved insertion attenuation. It results from the latter that only little energy is lost in the signal path due to the acoustic coupling of the interdigital transducers, since the acoustic energy escaping from an individual interdigital transducer can be re-coupled into the system at another location.

Due to the at least partial omission of the reflectors between acoustically coupled interdigital transducers, the often excessive power density at the transition between reflector and interdigital transducer is reduced.

Via the acoustic coupling, the acoustic length of the interdigital transducer is increased, and thereby edge effects are reduced, likewise the ripple connected with this.

In acoustically coupled interdigital transducers, the adjacent (coupled) interdigital transducer acts as a reflector. The reflector losses are thereby omitted; at the same time, the space necessary for the component is reduced.

By coupling acoustically various interdigital transducers not arranged in the same branch, the degree of necessary cascading is reduced in the filter; at the same time, a minimal number of electrode fingers and an optimally small aperture can be maintained.

Via the acoustic coupling, the excitation of counter-phase signals in an interdigital transducer is achieved, whereupon the stopband suppression and/or the insulation is increased in critical frequency ranges.

With the invention, it is achieved to reduce the power density within the electrode structures of the interdigital transducers and additionally to suppress non-linear effects that lead to unwanted modulation.

The invention proposes to also acoustically couple together interdigital transducers that are electrically connected with one another and are arranged on the surface of a piezoelectric substrate. For this, either at least two serial interdigital transducers are electrically connected in series and acoustically coupled in a serial branch that connects the input and the output of the component with one another, or the interdigital transducers of at least two parallel branches—between which lies a serial branch in which one or more interdigital transducers are arranged—are acoustically coupled. The acoustic coupling of the interdigital transducers occurs via an in-line arrangement within an acoustic track. It is also possible to arrange a serial and a parallel interdigital transducer within a track and to acoustically couple them with one another.

Via this coupling, new characteristics of the component are realized, whereby the degree of the coupling between the interdigital transducers can be varied and optimized.

Two interdigital transducers acoustically coupled with one another can be arranged directly adjacent in an acoustic track. The acoustic track is thereby advantageously bordered on both sides by one reflector respectively which respectively comprises a regular strip pattern of reflector strips. The reflection effect of a reflector is thereby dependent on the height, width and in particular on the number of reflector strips in addition to the selected substrate material. The frequency-dependent reflection of the reflector is determined by the separation of the reflector strips, and what is known as the finger period, that is selected corresponding to the finger period of the interdigital transducer or interdigital transducers. The number of the reflector strips in the reflectors is preferably so high that nearly complete reflection of the acoustic wave ensues at the reflector in the transmission range of the component (which is in particular fashioned as a filter). An interdigital transducer bordered by reflectors on both sides then represents a resonator. If two interdigital transducers are arranged next to one another and are bordered on both sides by reflectors, one obtains a two-port resonator with two electrical ports. An arbitrary number of interdigital transducers can be arranged and coupled in onetrack.

However, it is also possible to arrange the interdigital transducer of one type (serial or parallel) in different tracks. Coupling can thereby ensue in parallel in different tracks. In this manner, it is also possible that such interdigital transducers couple with one another that are not directly connected electrically with one another, for example two serial interdigital transducers between which in the circuit at least one further serial interdigital transducer is arranged. Parallel interdigital transducers can also be coupled which are arranged in not directly adjacent parallel branches. The coupling of a parallel interdigital transducer and a serial interdigital transducer is also possible.

However, it is also possible to acoustically couple all interdigital transducers of one type (serial or parallel) with one another. However, coupled and uncoupled interdigital transducers can both exist together within one type of interdigital transducer.

The type and strength of the coupling between two interdigital transducers can be influenced by means of different possibilities:

a) Partially transmissive reflectors or
b) metallized delay lines can be arranged between the coupling interdigital transducers.
c) The apertures of the coupling interdigital transducers can be selected differently.
d) Different voltages can appear at the interdigital transducers coupling with one another.
e) A phase difference is set between the interdigital transducers coupling with one another.

In an embodiment a), the acoustic coupling of adjacent interdigital transducers is reduced by acoustically partially transmissive intermediate reflectors. Such an intermediate reflector is comprised of a number of n reflector strips, whereby n is selected such that no complete reflection ensues and an acoustic coupling of the interdigital transducers separated by the intermediate reflector is possible. Typically, the value of n is $0 \leq n \leq 100$. With increasing n, the acoustic coupling of the interdigital transducers separated by the intermediate reflector is reduced. Via a suitable dimensioning of the number n, the characteristics of the coupled interdigital transducer and the characteristics of the entire component can therewith be influenced or, respectively, adjusted, whereby in the borderline case of n=0 no intermediate reflector is provided and the coupled interdigital transducers are directly adjacent to one another, whereby maximum coupling is attained. Moreover, if n changes from even-numbered to odd-numbered, the phase of the coupling can be varied by 180°.

A fine-tuning of the phase of the acoustic coupling can be done via a variation of the separation of the interdigital transducers from one another or between the interdigital transducers and the reflectors, whereby a structure similar to DMS filters is obtained. The interdigital transducers are displaced against one another such that the phase of the acoustic coupling between both interdigital transducers exhibits a difference $\Delta\phi$ with $-90°<\Delta\phi<90°$. In particular, via a variation of the separation, additional resonances that are like in a DMS filter can be used to form the filter transfer function and the edges.

The free distance between two interdigital transducers can also be provided with a wholly or partially metallized delay line with which, in addition to the coupling, the speed of the surface wave can be influenced or the propagation of the surface wave can be maintained surface-proximal.

A variation of the voltage occurring at an interdigital transducer is achieved via cascading. An interdigital transducer is thereby replaced by a series circuit of two or generally m resonators (m is greater than or equal to 2). One thus obtains a reduction of the voltage U to a value of U/m at the same separation of the busbars. Intermediate values are obtained when one varies the separations of the busbars of individual interdigital transducers within the cascading. The power density within the interdigital transducers is therewith reduced and the acoustically active surface is increased. A reduction of the power density reduces the material wear and the occurrence of errors, and also increases the reliability and the lifespan of the component.

The cascading can be done transverse to the propagation direction of the surface wave, whereby the cascaded interdigital transducers can be arranged in various acoustic tracks.

The cascading can also occur via series circuiting of in-line, successively arranged interdigital transducers.

A cascade can also be singly or multiply folded, and thus simultaneously comprise both interdigital transducers arranged next to one another in various acoustic tracks and interdigital transducers arranged successively within one acoustic track. In-line, successively arranged interdigital transducers within the same cascade or in different but adjacent cascades can be acoustically coupled with one another. U-shaped or meander-shaped arrangements of interdigital transducers are created by the folding.

In particular given cascades that are folded or, respectively, are coupled with one another, large voltage differences can occur between the respective terminal (and therefore directly or nearly adjacent) electrode fingers of different coupled interdigital transducers. Electrical flash-overs during the operation of the component can advantageously be prevented when the directly adjacent terminal electrode fingers are respectively attached to the busbars that exhibit the lowest electrical potential difference relative to one another. In cascades transverse to the acoustic track, it is also possible to extend electrode fingers lying at an average potential so that in the adjacent track they form a shielding between the terminal electrode fingers of the coupled interdigital transducers arranged there, lying at the extreme potential or, respectively, they form a transition with lower potential difference.

A cascade can also comprise in-line, adjacently arranged interdigital transducers in which a center interdigital transducer is connected in series with the outward interdigital transducers neighboring on both sides and is also acoustically coupled with these. The outward interdigital transducers can be cascaded and coupled with further interdigital transducers arranged in-line.

In order to attain the same impedance in a cascade as in an uncascaded interdigital transducer, an enlargement of the surface of the cascaded interdigital transducer is necessary for a component fashioned as a filter. Given m cascaded interdigital transducers, a total area $A_m$ of $m^2 A_0$ is necessary in the cascade, whereby $A_0$ corresponds to the surface of an uncascaded interdigital transducer.

In a development of the invention, the specified simple embodiments of the invention can be expanded by arbitrary further elements, in particular by additional interdigital transducers. For example, it is possible to connect a complete one-port resonator, thus an interdigital transducer bordered on both sides by reflectors, in the serial arm. Additional acoustically not coupled interdigital transducers in the serial arm can but do not have to be arranged in-line to the existing serial interdigital transducers.

Each parallel branch connects the serial branch with a reference potential. It is thereby possible to effect the consolidation of a plurality of parallel branches at an intermediate stage before a final connection with the reference potential (ground). Each parallel branch can comprise a plurality of interdigital transducers that are, for example, connected in series among one another. Interdigital transducers can also be connected in parallel to one another in a parallel branch. An arbitrary cascading of parallel interdigital transducers is also possible.

In a further embodiment of the invention, a parallel interdigital transducer arranged in a parallel arm is part of a DMS filter. Such a one is, for example, fashioned from three interdigital transducers that are arranged between two reflectors. Such a DMS filter exhibits two resonance poles via suitably selected separations of the interdigital transducers. The parallel arm is, for example, connected with the middle interdigital transducer of a DMS filter which is connected in series with both of the adjacent outer interdigital transducers. Both outer interdigital transducers are subsequently connected with a reference potential or, respectively, ground via the opposite busbar.

It is also possible to provide DMS structures in the serial branch, whereby two or more interdigital transducers can be connected in series with one another. The busbar which is typically provided for a ground connection can thereby be connected with the reference potential via a parallel arm with and without parallel interdigital transducers.

With the same finger period, the interdigital transducers can also be displaced relative to one another by an amount $\Delta x$, such that $-0.25 < \Delta x/\lambda < 0.25$ is true, whereby $\lambda$ is the acoustic wavelength at a center frequency of the component, in particular of the filter.

From the electrical circuiting, inventive components have a structure similar to reactance filters; however, they operate differently due to the acoustic coupling of the interdigital transducers. Nevertheless, it is of advantage to displace the resonator frequencies (dependent on the finger period) of serial and parallel interdigital transducers relative to one another. Each interdigital transducer exhibits a resonance frequency with minimal impedance (zero point) and an anti-resonance frequency with maximum impedance (pole point). The anti-resonance frequency is thereby above the resonance frequency. The resonance frequency of the serial interdigital transducers is selected so that it is approximately at the anti-resonance frequency of the parallel interdigital transducer. The lower edge of the transmission range (passband) is then determined by the position of the resonance frequency of the parallel interdigital transducers; the upper edge of the transmission range is determined by the anti-resonance of the serial interdigital transducers. To broaden the transmission range, it is possible to select the resonance frequency of the serial interdigital transducers above the anti-resonance frequency of the parallel interdigital transducers. A maximum separation can be selected so that an optimal transmissibility is still ensured combined with a tolerable ripple in the transmission range.

The interdigital transducers of one branch (serial or parallel) can be detuned relative to one another by a small amount. The detuning should preferably be less than 1%.

It is also possible to detune the interdigital transducers relative to one another in both types of branches.

The electrical connections between the interdigital transducers can be fashioned as normal conductor lines on the piezoelectric substrate. However, it is also possible to realize at least one part of the electrical connections between the interdigital transducers, between the interdigital transducers and input or output, or between the interdigital transducers and the reference potential as discrete elements. Such discrete elements can be, for example, capacitors, delay lines, resistors, inductors, bond wires, bumps or other suitable connection elements.

The interdigital transducers, the reflectors and the conductive structures connecting them in the circuit can inventively be fashioned as metallic structures and be comprised of aluminum, an aluminum alloy or multilayer structures, wherein the individual layers of the multilayer structure comprise one or more layers made from aluminum, an aluminum alloy or additional metals such as Cu, Zr, Mg, Ti or Sc. Passivation layers made from chemically inert and in particular hard materials such as oxides, nitrides, carbides and similar metal compounds can be provided over the metallic structures.

The layer thicknesses h of the metallic structures are preferably selected in the range of $1\% < h/\lambda < 15\%$.

A further variation of inventive components is to vary the finger periods of individual interdigital transducers viewed over their length. Within an interdigital transducer, the metallization ratio (thus the ratio of finger width to finger period) can likewise be varied over the length of the transducer. The variation both of the metallization ratio and of the finger period preferably ensues according to a continuous function, such that the concrete values for metallization ratio or finger period correspond to the precise values of a periodically sampled continuous function. Such a function can be linear, such that the corresponding values rise over the length of the transducer. However, it is also possible to carry out the variation according to any other functions. The variation preferably ensues according to functions that exhibit a maximum or a minimum inside the transducer. Given a variation of finger period and/or metallization ratio, within an interdigital transducer or reflector the respective size fluctuates by a maximum of approximately 3% around the respective average value.

Also of advantage is a component in which the position of the transversal gaps in one type of interdigital transducers selected from serial and parallel interdigital transducers is varied over the length of the interdigital transducer. By transversal gap, what is thereby understood is the separation of the ends of the electrode fingers in an interdigital transducer from the opposite busbar. For the height g of the transversal gaps, a formula $g \leq \lambda/4$ may hold true.

The size of the gaps can also be varied in at least one of the interdigital transducers, viewed over the length of the interdigital transducer.

In an advantageous manner, independent of finger period, finger separation, finger width and metallization ratio in the interdigital transducers and reflectors, the transition between two adjacent elements (selected from interdigital transducers and reflectors) respectively within an acoustic track is designed quasi-periodic as is, for example, specified in the international application WO0025423, the whole content of which is referred to here.

For constant and as well as varying metallization ratio, this is preferably larger than 0.5 and particularly preferably larger than 0.6.

For the electrical connections between the elements on the substrate, in particular between the interdigital transducers, it is true that they preferably exhibits at least the same layer thickness as the elements. These connections are preferably fashioned as metal areas and in particular with a greater layer thickness than the interdigital transducers.

In an inventive component, a DMS structure that is acoustically coupled with at least one serial interdigital transducer is arranged in the serial branch.

In an inventive component, all serial interdigital transducers can be arranged in a common serial track and all parallel interdigital transducers can be arranged in a common parallel track. The aperture of the parallel track can then in a simple manner be selected larger than that of the serial track. The aperture of the serial track is preferably at least $15\lambda$, whereby $\lambda$ is the acoustic wavelength at a center frequency of the component.

An inventive interdigital transducer can be fashioned as a normal finger transducer with alternating connection sequence of the electrode fingers. However, it is also possible to differently design the connection sequence of the electrode fingers, thus the sequence with which the electrode fingers are connected with the correspondingly polarized busbars. If, in a transducer, electrode fingers are interchanged in the connection, thus connected with the opposite busbar, one speaks of withdrawal weighting. Non-alternating connection sequences can also be realized via recursive transducers. In such transducers fashioned, for example, as SPUDT transducers, the finger widths can also be different in order to adjust a reflectivity that interacts with the phase of the excitation in an advantageous manner.

The electrode fingers of the interdigital transducers can inventively also be selected of a different length. In such a case, one obtains a varying overlapping of differently polarized electrode fingers, an overlap weighting. Since the respective overlapping of oppositely polarized electrode fingers is a measure for the excitation of acoustic waves via the field between the two fingers, the excitation can be distributed over the transducer with such an overlap weighting. This is also possible with an withdrawal weighting. Further variation possibilities of the interdigital transducer also result via position weighting, this is by shifting of electrode fingers or electrode finger groups that are then no longer strongly aligned to the pattern predetermined by the finger period and are thereby varied both in the reflection effect and in the excitation strength.

An inventive component with a reactance filter structure can operate with all surface-proximal acoustic waves. Which type of acoustic wave is preferably excited is in particular dependent on material and cut angle of the selected piezoelectric substrate, which can also comprise a piezoelectric film that is applied on a suitable substrate.

The piezoelectric substrate can be comprise one of the materials $LiTaO_3$, $LiNbO_3$, quartz, langasite (LGS), langatate (LGT), $GaBO_4$, $Li_2B_4O_7$, langanite (LGN), $KNbO_3$ or GaAs.

If the substrate is a piezoelectric film on a carrier, the piezoelectric film is thus preferably fashioned from a material selected from $LiTaO_3$, $LiNbO_3$, AlN, ZnO or GaAs.

The wave type can also be dependent on the operating frequency of the component. In particular the cited surface acoustic wave (SAW), Rayleigh waves, shear waves, leak waves, BGS waves (Bleustein Gulyaev Shimizu waves) or HVP-SAW (high velocity pseudo surface acoustic waves) are suitable as surface-proximal acoustic waves. In principle the same electrode structures or, respectively, exciting interdigital transducers are suitable for all of these wave types.

In the following, the invention is explained in detail using exemplary embodiments and the associated Figures. Figures are only schematic and are therefore not to scale. The same or identically operating parts are designated with the same reference characters.

DESCRIPTION OF THE PREFERRED EMBODIMENTS

Figure 1:
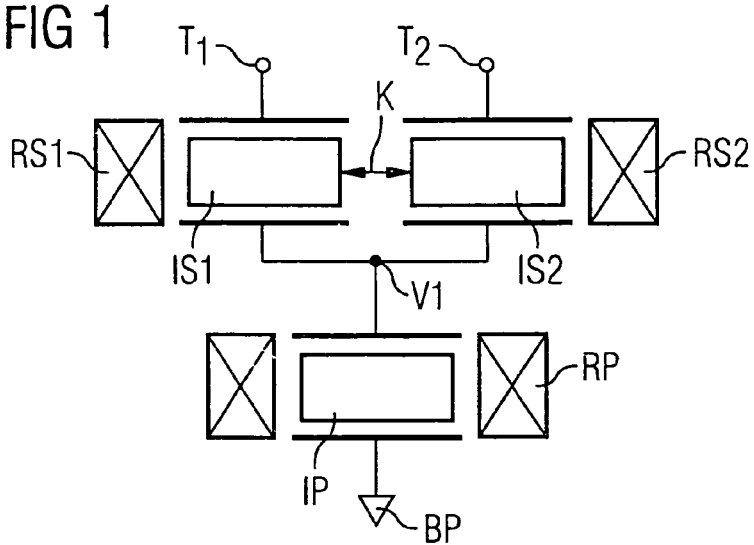
FIG. 1 shows an arrangement with two serially coupled interdigital transducers.

FIG. 1 shows a first inventive component operating with surface-proximal acoustic waves in which a first serial interdigital transducer IS1 and a second serial interdigital transducer IS2 are connected in series between a first connection T1 and a second electrical connection T2. Both of the interdigital transducers are arranged in-line consecutively in the propagation direction and close to one another, so that they can acoustically couple with one another, as indicated by the double-arrow K. The acoustic track with the serial interdigital transducers IS1, IS2 is bordered on both sides by one reflector RS1, RS2 per side. A parallel interdigital transducer IP that is bordered on both sides by one reflector RP per side is arranged between a branching point V1 that is placed in the circuit between both serial interdigital transducers IS1 and IS2 and a reference potential BP. A one port resonator is fashioned in the parallel branch while both serial interdigital transducers with all of their reflectors form a two-port resonator. In contrast to the known arrangements with acoustically coupled interdigital transducers, here the two interdigital transducers IS1 and IS2 coupling acoustically with one another are not identical. They feature either a different aperture, a different pitch (finger period), a different number of electrode fingers, a different metallization thickness or a different weighting.

Figure 2:
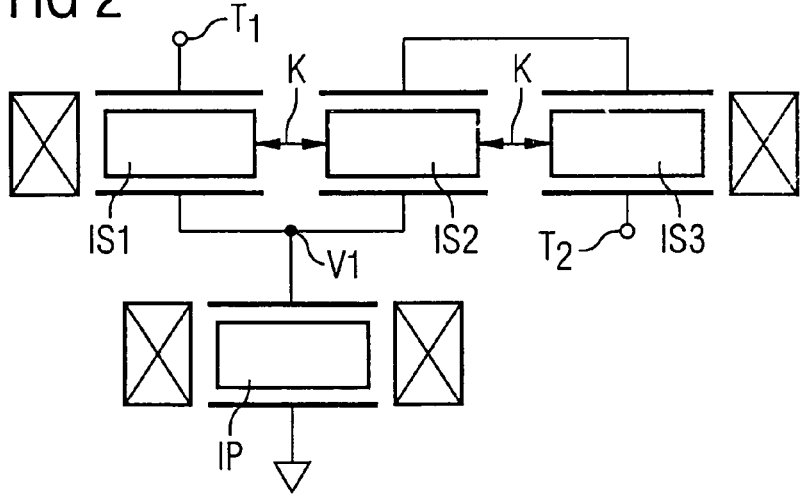
FIG. 2 shows an arrangement with three acoustically coupled serial interdigital transducers.

FIG. 2 shows a further embodiment of the invention that, in a modification from FIG. 1, comprises a third serial interdigital transducer IS3 that is arranged in-line with both of the other serial interdigital transducers IS1 and IS2 and is acoustically coupled with these. Here as well a parallel branch with an interdigital transducer IP is connected between a branching point V1 and the reference potential. In contrast to the known arrangements, here the symmetry of the branching circuit is disturbed: the interdigital transducers IS2 and IS3 are serially cascaded without the provision of a branching point for branching a parallel branch between the two.

Figure 3:
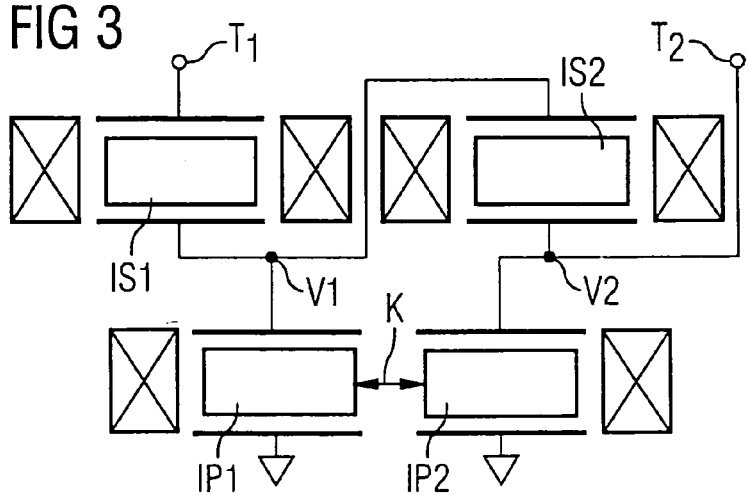
FIG. 3 shows an arrangement with two acoustically coupled parallel interdigital transducers.

FIG. 3 shows another embodiment in which two serial interdigital transducers IS1, IS2 are arranged in a serial branch between a first and a second connection T1, T2. Each of the interdigital transducers is bordered by two reflectors per interdigital transducer, so that no coupling can occur between the two interdigital transducers IS. One parallel branch per branching point V1, V2 is connected from a first and a second branching point V1, V2 of the serial branch to a reference potential. In a first parallel branch, a parallel interdigital transducer IP1 is arranged and in a second parallel branch, a second parallel interdigital transducer IP2 is arranged. Both of the parallel interdigital transducers are acoustically coupled, which is indicated in the Figure via the double arrow K. A coupling can occur when both parallel interdigital transducers IP are arranged at least partially in the same acoustic track.

Figure 4:
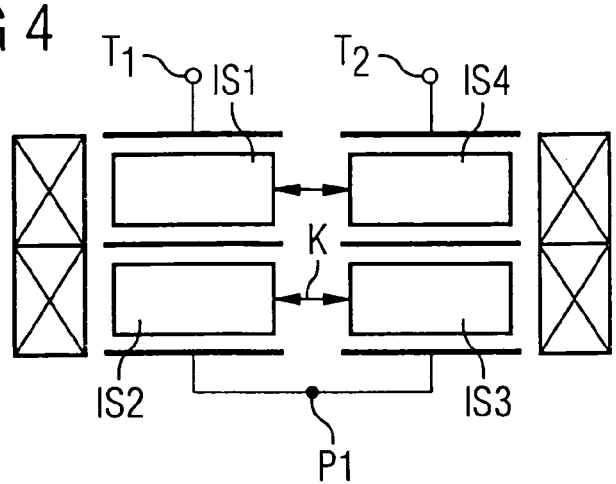
FIG. 4 shows two coupled cascades of interdigital transducers.

FIG. 4 shows an inventive arrangement in which four interdigital transducers IS1 through IS4 are connected in series between a first and a second connection T1, T2. Every two interdigital transducers are cascaded, such that in total a folded quad-cascade of serial interdigital transducers IS is obtained. Both (sub-)cascades comprising the interdigital transducers IS1 and IS2 or, respectively, IS3 and IS4 are spatially adjacent due to the U-shaped folding of the serial branch or, respectively, in general of the branch of the circuit, so that an acoustic coupling can occur between respectively two serial interdigital transducers arranged in different cascades, in particular a coupling between IS1 and IS4 or, respectively, between IS2 and IS3, as shown by the double-arrow K. The serial branch is folded at the circuit point P1, so that a parallel branch can branch off at this point. The arrangement is bordered by reflectors on both sides, so that a resonance space is opened between both reflectors within each track.

Figure 5:
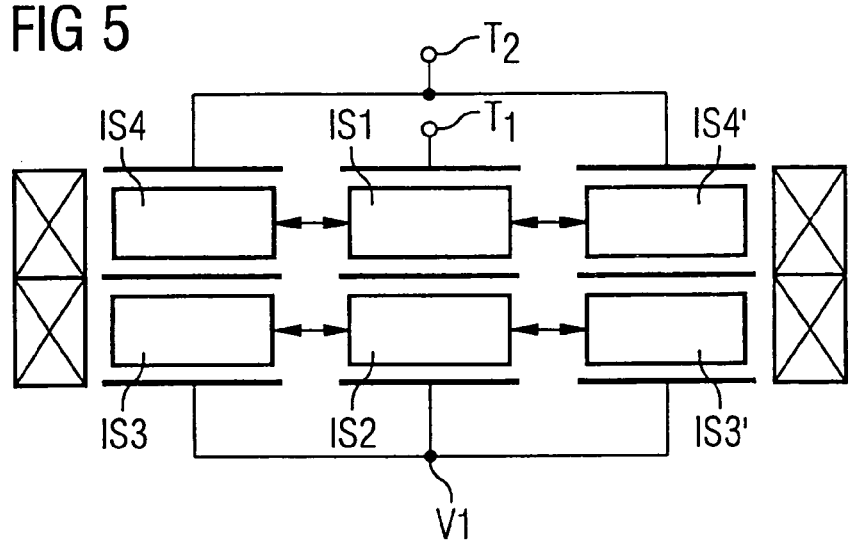
FIG. 5 shows three acoustically coupled cascades of interdigital transducers.

FIG. 5 shows yet another arrangement of cascaded interdigital transducers. Two serial interdigital transducers IS1, IS2 are connected in series and arranged next to one another, transverse to the propagation direction of the acoustic wave, between a first connection T1 and a branching point V1. Two cascades, each made from two interdigital transducers, are connected in parallel between the branching point V1 and the second external connection T2. A first cascade comprises the interdigital transducers IS3 and IS4; the second cascade connected in parallel thereto comprises the interdigital transducers IS3' and IS4'. The cascades are arranged relative to one another so that one interdigital transducer is arranged per cascade in (in total) two acoustic tracks made from both cascades, and that acoustic coupling occurs within a track between the three interdigital transducers arranged there.

Figure 6:
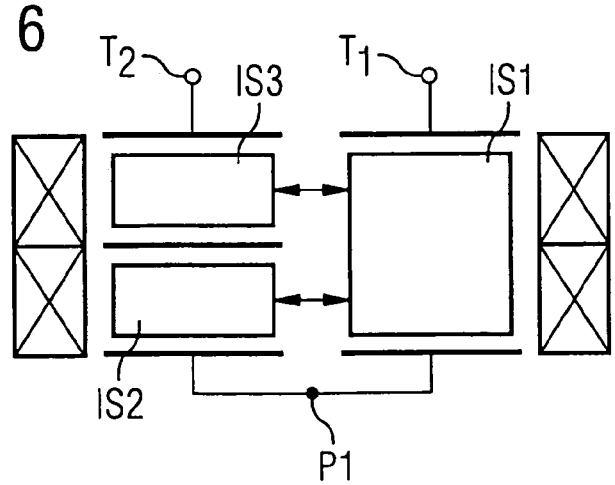
FIG. 6 shows the coupling of a cascade with a single interdigital transducer.

FIG. 6 shows a further embodiment of the invention in which a first serial interdigital transducer IS1 is connected in the serial branch in series with a cascade made from a second and a third serial interdigital transducer IS2, IS3. The circuit is folded at point P1 such that the cascade is arranged in-line with the first interdigital transducer IS1 whose aperture corresponds to the sum of the apertures of the second and third interdigital transducers IS2, IS3. The first interdigital transducer IS1 is therewith acoustically coupled (see double-arrow) with both the second interdigital transducer and the third interdigital transducer. The arrangement of transducers is bordered by reflectors on both sides.

Figure 7:
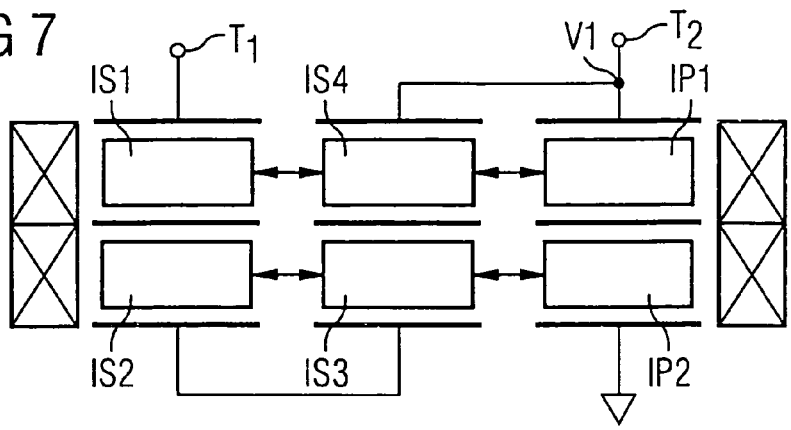
FIG. 7 shows the acoustic coupling of two cascades of serial interdigital transducers with a cascade of parallel interdigital transducers.

FIG. 7 shows a still further arrangement in which four serial interdigital transducers IS1 through IS4 are arranged in a single-fold cascade between a first and a second connection T1, T2, so that each two interdigital transducers are acoustically coupled with one another, as shown by the double-arrows. A parallel branch is connected from a branching point V1 placed near the second connection T2 to a reference potential in which is arranged a further cascade made from two parallel interdigital transducers IP1, IP2. The spatial arrangement of the parallel branch is such that each parallel interdigital transducer is acoustically coupled with each serial interdigital transducer of an adjacent serial cascade, as shown by the double-arrows.

Figure 8:
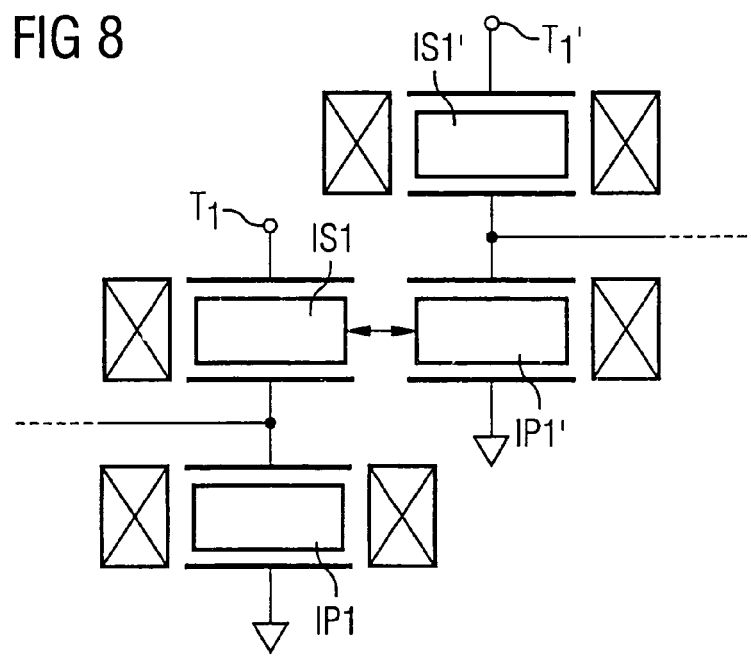
FIG. 8 shows the coupling of interdigital transducers arranged in different circuits of a component.
Figure 9:
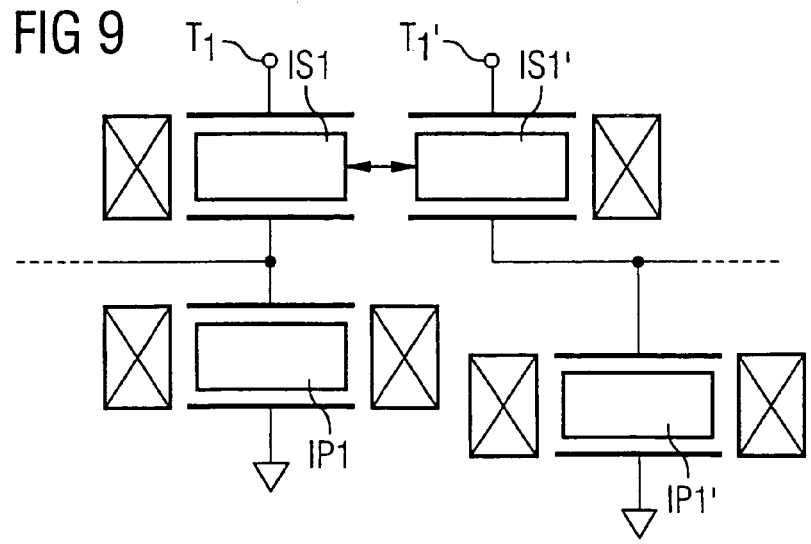
FIG. 9 shows an embodiment in which the interdigital transducers of two different circuits are acoustically coupled.

FIG. 8 shows yet another embodiment of the invention in which an acoustic coupling occurs between interdigital transducers that are arranged in domains separated from one another. Such separated domains that are arranged within a component can, for example, be interdigital transducers or, respectively, resonators comprising interdigital transducers that are part of a filter circuit and are arranged in an RX branch or a TX branch of a wireless communication apparatus. In the Figure, the arrangement has an acoustic coupling between a serial interdigital transducer IS1 of a first branch and a parallel interdigital transducer IP1 that is arranged in the parallel branch of a second circuit domain. It is also possible, as shown for example in FIG. 9, that an acoustic coupling occurs between two serial interdigital transducers IS1, IS1', whereby both interdigital transducers are arranged in the separate circuits and are respectively arranged there in the serial branch. Arrangements (not shown in the Figure) are also possible in which parallel branches in separate circuits or, respectively, the parallel interdigital transducers provided therein are coupled with one another. The interdigital transducers of the respective other branch are not coupled.

Figure 10:
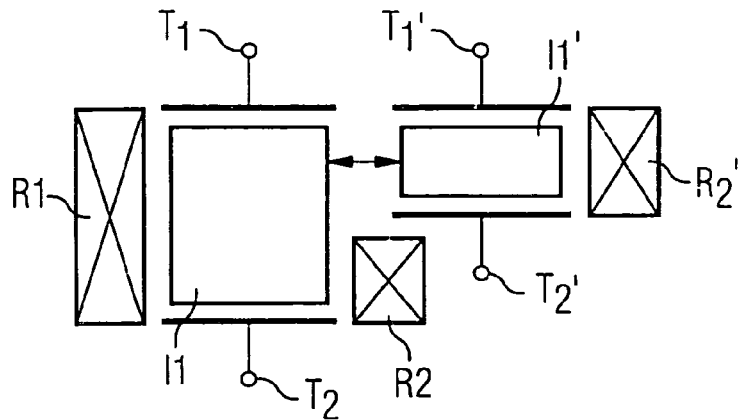
FIG. 10 shows the acoustic coupling of two interdigital transducers with different apertures.

FIG. 10 shows a further possibility to arrange two domains separate from one another, with the domains here being connected between a first and a second connection T1 and T2 or, respectively, between T1' and T2', in spatial proximity relative to one another so that interdigital transducers I1 and I1' (serial or parallel) acoustically couple with one another in the integrated circuits. Due to the different aperture of the two coupling interdigital transducers, only a partial coupling ensues, whereby the track or, respectively, the partial tracks are bordered on both sides by at least one reflector. Couplings between interdigital transducers of different circuits can also occur between interdigital transducers that are arranged in different branches, for example in the serial and parallel branch.

Figure 11:
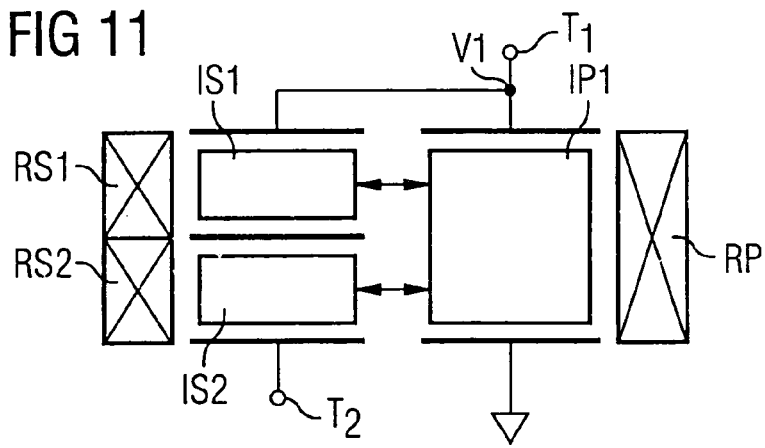
FIG. 11 shows a similar coupling, whereby the interdigital transducers are arranged in different branches of a component.

FIG. 11 shows an arrangement in which a cascade of two interdigital transducers IS1, IS2 is connected in a serial branch between first and second connection T1, T2. A parallel interdigital transducer with doubled aperture is connected between a branching point V1 and the reference potential, so that it acoustically couples both with the first and with the second interdigital transducers IS1, IS2.

Figure 12:
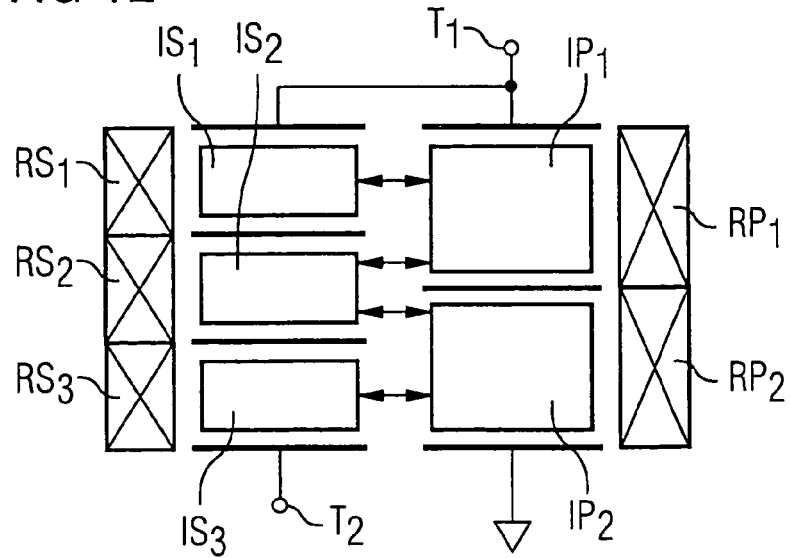
FIG. 12 shows a further variation in which two cascades with different apertures are acoustically coupled with one another in different branches.

FIG. 12 shows a similar embodiment in which the aperture of the parallel interdigital transducers IP1 and IP2 arranged within a double cascade in the parallel branch exhibits a non-whole number multiple of the aperture of the serial interdigital transducers that are arranged as a triple cascade in the serial branch. Serial and parallel cascades are arranged next to each other so that an acoustic coupling occurs between first parallel interdigital transducer IP1 on the one side and first and second interdigital transducers IS1 and IS2 on the other side, as well as an acoustic coupling between the second parallel interdigital transducer IP2 on the one side and the second and the third serial interdigital transducers IS2 and IS3 on the other side.

While in previous Figures the interdigital transducers were only schematically indicated by small boxes, in reality, however, they represent electrode combs engaging with one another on two sides in comb-like fashion and are connected with different busbars. The arrangement of electrode fingers within such a transducer can be alternatingly regular, so that alternatingly fingers go out from the busbar and all electrode fingers uniformly overlap with one another. However, also interdigital transducers are possible that exhibit an irregular finger sequence or possess a different overlapping length. If the overlapping length of different busbars of outgoing electrode fingers varies, one speaks of a weighting.

Concerning the spatial arrangement of two acoustically coupled interdigital transducers relative to one another, this must be such that an acoustic coupling can occur. This is always the case when the second interdigital transducers I2 is located within the acoustic track of the first interdigital transducer I1 or is at least partially arranged within the acoustic track. The spatial distance must be so small that acoustic waves generated in the first interdigital transducer I1 can arrive in the second transducer there couple without losing their energy before arrival.

Figure 13A:
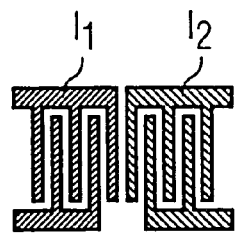
FIGS. 13A, 13B and 13C show various transitions of interdigital transducers acoustically coupled with one another.
Figure 13B:
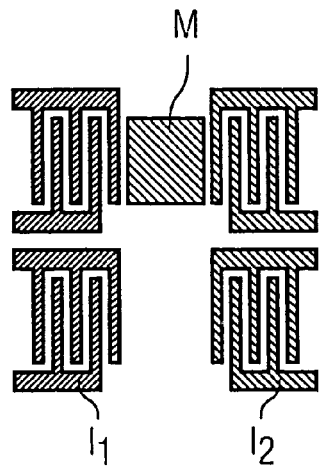
Figure 13C:
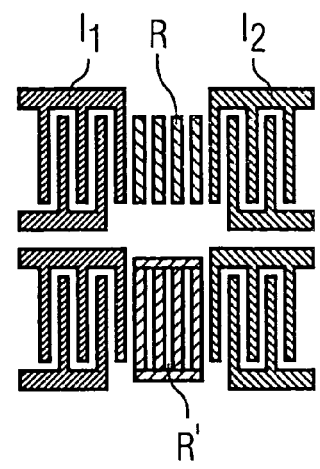

FIGS. 13A, 13B and 13C show different possibilities to arrange two acoustically coupled interdigital transducers I1, I2 relative to one another. In FIG. 13A, both interdigital transducers I1, I2 are arranged so close to one another that the adjacent respective terminal electrode fingers exhibit a separation that corresponds to the separation of the electrode fingers within each of the two transducers I1, I2. Dependent on the polarity of the busbars of the interdigital transducers I1, I2, a phase difference of either 0 or 180° arises in this manner.

FIG. 13B shows acoustically coupled interdigital transducers I1, I2 whose terminal electrode fingers facing towards one another are separated from one another by an amount that exceeds the separation of the electrode fingers within each of the transducers. The substrate surface between the two transducers can thereby be uncovered and free, as is shown below in FIG. 13B. However, it is also possible to cover the substrate surface between both of the acoustically coupled interdigital transducers via a metallization M, for example as is shown above in FIG. 13B. The separation between both interdigital transducers can be arbitrary, so that each desired phase difference between the two interdigital transducers can be adjusted.

A further possibility is, as shown in FIG. 13C, to fill up the separation between two interdigital transducers I1, I2 acoustically coupled with one another with reflecting structures R or R'. The reflecting structures can be reflector stripes or strips arranged at a predetermined distance, as indicated above in FIG. 13C. However, it is also possible to provide a shorted reflector grid R' between both of the interdigital transducers coupled with one another. In each case, the reflection effect and therefore in particular the number of the reflector stripes is chosen so that no complete reflection occurs, so that the reflector R, R' is partially transmissive for the acoustic waves. The extent of the acoustic coupling between the two interdigital transducers can be adjusted via the reflection effect. The number of the reflector strips can be selected between 1 and 100.

Figure 14:
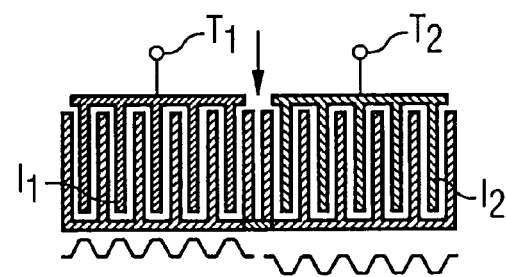
FIG. 14 shows two coupled interdigital transducers with non-exciting electrode fingers between the transducers.

FIG. 14 shows another aspect of the invention that concerns the precise design at the transition between two interdigital transducers acoustically coupled with one another. Depending on circuiting and arrangement of the interdigital transducers, between adjacent electrode fingers of different interdigital transducers a potential difference can occur that is significantly larger than the potential difference that normally occurs between the different electrode fingers within a transducer. Too-large of the potential differences can, however, lead to an electrical flash-over in the operation of an interdigital transducer (in that a high-frequency signal is applied to one or both of the external connections) that can at least impair the operation of the transducer and also often can lead to damage or even destruction of the component. In an inventive further development, the transition between acoustically coupled interdigital transducers is designed so that the potential difference between adjacent electrode structures is minimized. FIG. 14 shows an arrangement of two interdigital transducers I1, I2, which are arranged in-line, serially circuited with one another and acoustically coupled, in that the terminal fingers of both interdigital transducers are attached to the same busbar and namely to the busbar with average potential. No potential difference therewith dominates between the two terminal electrode fingers; the normal potential difference dominates between the terminal and the adjacent electrode fingers within a transducer. The potential curve in the operation of the transducer is indicated by corresponding sine curves below the transducer in this and other Figures. It is clear that no potential difference occurs between the two transducers at the location indicated with the arrow.

Figure 15:
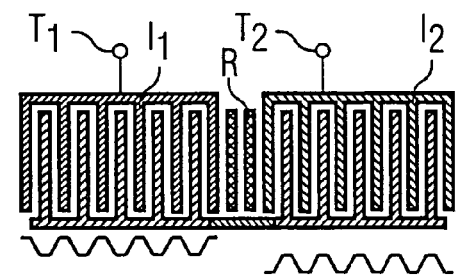
FIG. 15 shows two acoustically coupled interdigital transducers with a floating reflector between them.

In FIG. 15, a floating reflector R is arranged between both interdigital transducers I1, I2 acoustically coupled with one another and electrically connected in series. In this manner, the potential difference between the terminal electrode fingers in both interdigital transducers I1, I2 and the reflector R is maximally half of the value that can occur between the two terminal electrode fingers of different interdigital transducers. Thus the probability of an electrical flash-over between the electrode structures of difference potentials is also reduced.

Figure 16:
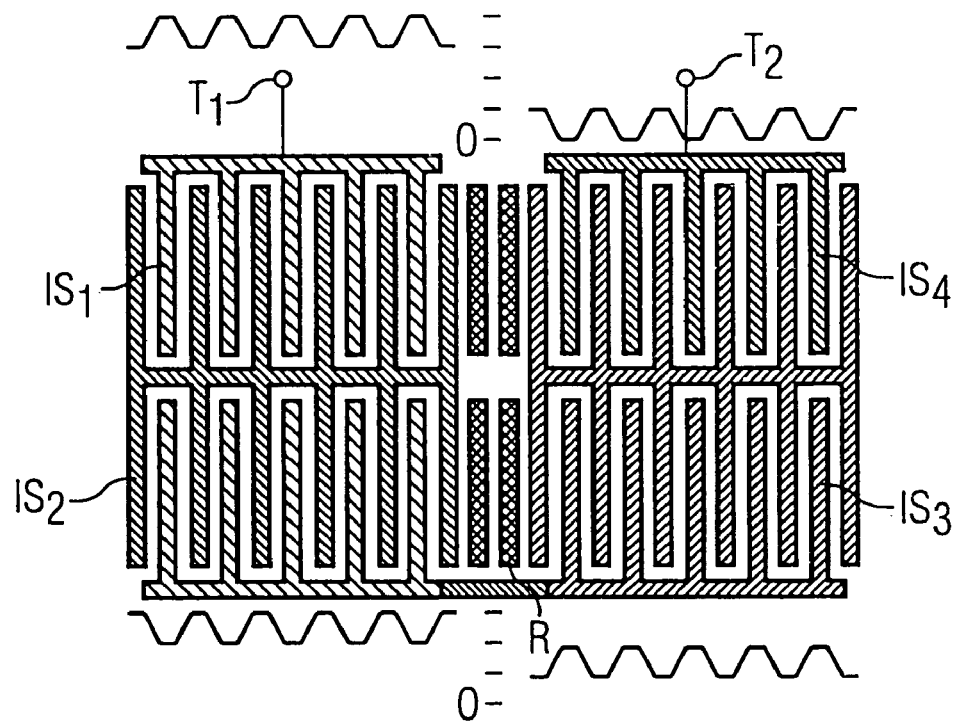
FIG. 16 shows two coupled cascades with floating reflector between coupling interdigital transducers.

FIG. 16 shows two cascades connected in series, each made of two interdigital transducers, that are arranged U-shaped so that respectively two interdigital transducers from different cascades acoustically couple with one another. In total, five different potentials that could lead to a high potential difference of adjacent structures between the extreme potentials can occur via the cascading at electrode structures not electrically connected with one another. This is inventively prevented in the inventive embodiment according to FIG. 16 in that floating reflector structures R are arranged per track between both cascades. The electrode structures adjacent to the reflector structure are moreover not at the maximum potential, so that the potential difference is also reduced in this manner.

Figure 17:
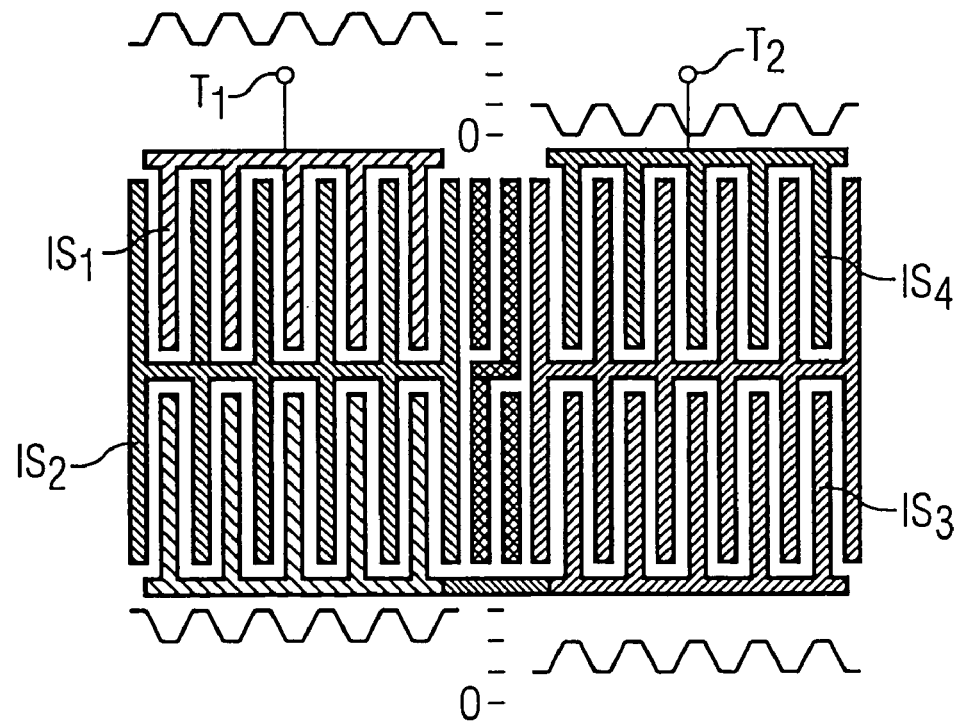
FIG. 17 shows two cascades of coupled interdigital transducers with a coupling reflector structure between them.

FIG. 17 shows a cascade similar to FIG. 16, with the difference that the reflecting structures are electrically-conductively connected with each other between interdigital transducers acoustically coupling with one another and arranged in different tracks. In this manner, a capacitive coupling between different interdigital transducers is achieved, for example via the electrical connection between the lower interdigital transducer of the first cascade and the upper interdigital transducer IS4 of the second cascade arranged in the other track.

Figure 18:
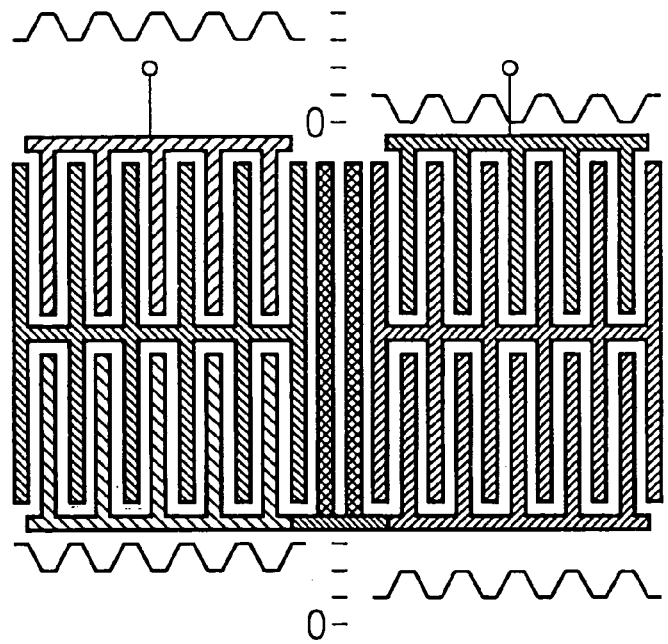
FIG. 18 shows two cascades of interdigital transducers acoustically coupled with one another with two non-exciting electrode fingers between them.

FIG. 18 shows a further possibility to reduce the potential difference between terminal electrode structures within folded cascades. Two double-cascades are electrically connected in series via the lowermost busbar. The lowermost busbar thereby lies at an average potential, for example at an electrically neutral potential. For better gradation of the potential differences, two terminal electrode fingers are connected with the lower busbar lying at the average potential and are extended so that they can act as exciting electrode fingers in the lower track and, in contrast to this, as counterphase-exciting in the upper track.

FIGS. 19A, 19B, 19C and 19D show various possibilities as to how an individual interdigital transducer can be replaced by a cascade of a plurality of interdigital transducers. Since the voltage applied between the connections T1, T2 is divided to the individual cascaded transducers due to the cascading, the excitation strength is reduced in the individual interdigital transducers. In order to replace the non-cascaded individual interdigital transducer (shown in FIG. 19A) of a given footprint with a triple-cascade as in FIG. 19B, an increase of the total footprint (resonator surface) of all interdigital transducers by the factor $n^2$ is necessary, whereby n represents the number of cascade stages (in the Figure: n=3). A triple-cascade according to FIG. 19B exhibits the same impedance as the individual interdigital transducer in FIG. 19A, which requires only a ninth of the footprint.

Figure 19A:
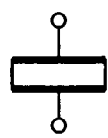
FIGS. 19A, 19B, 19C and 19D show various possibilities of cascading at a given constant excitation.
Figure 19B:
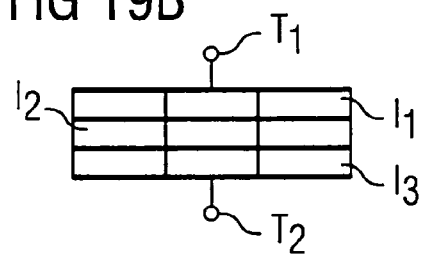
Figure 19C:
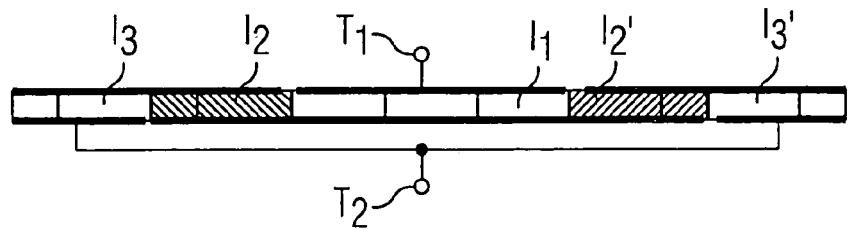

FIG. 19C shows the possible embodiment of a triple cascading of interdigital transducers that likewise exhibit an impedance nearly equal to that of the individual interdigital transducer in FIG. 19A. All cascaded transducers are arranged in-line within an acoustic track. A first interdigital transducer I1 (serial or parallel) is connected in series with second interdigital transducers I2, I2' and third interdigital transducers I3, I3'. The first interdigital transducer I1 thereby represents the middle interdigital transducer, so that both adjacent outer interdigital transducers I2 and I2' are connected in parallel to one another but in series to the first interdigital transducers I1. The third interdigital transducers I3, I3' are likewise connected in parallel to one another, however in series to I1. The necessary ninefold-increased footprint of this cascaded arrangement is here distributed on an acoustic track with constant aperture. However, it is also possible to change the apertures within the cascade and thus to achieve in the horizontal or vertical direction an enlargement or shrinking of the geometric dimensions of the cascade.

Figure 19D:
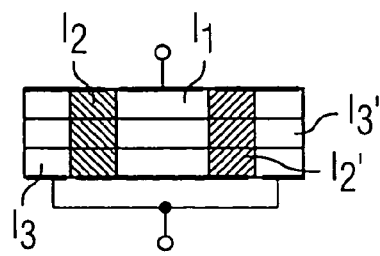

FIG. 19D shows an arrangement that, with regard to the circuiting, corresponds to the arrangement according to FIG. 19C that, however, exhibits a significantly smaller dimension in the propagation direction of the acoustic wave.

Figure 20:
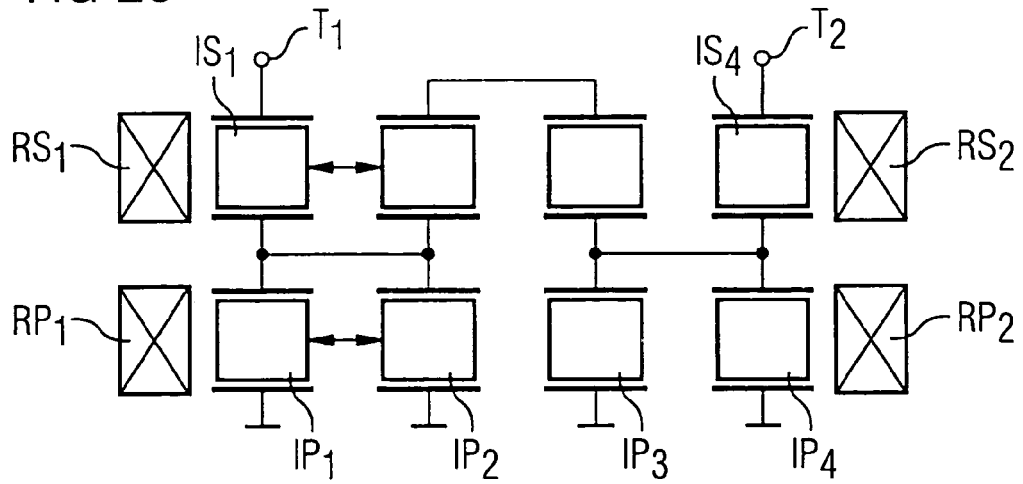
FIG. 20 shows an arrangement in which respectively serial and/or parallel interdigital transducers are acoustically coupled.

FIG. 20 shows four in-line serial interdigital transducers IS1 through IS4 circuited in a serial branch between a first and a second connection. Parallel to this are four parallel branches, each connected with a parallel interdigital transducer IP1, IP2, IP3, IP4. Serial and parallel interdigital transducers are respectively arranged in a common track between two reflectors RS1, RP1 and RS2, RP2 bordering the track and are acoustically coupled among one another.

Figure 21:
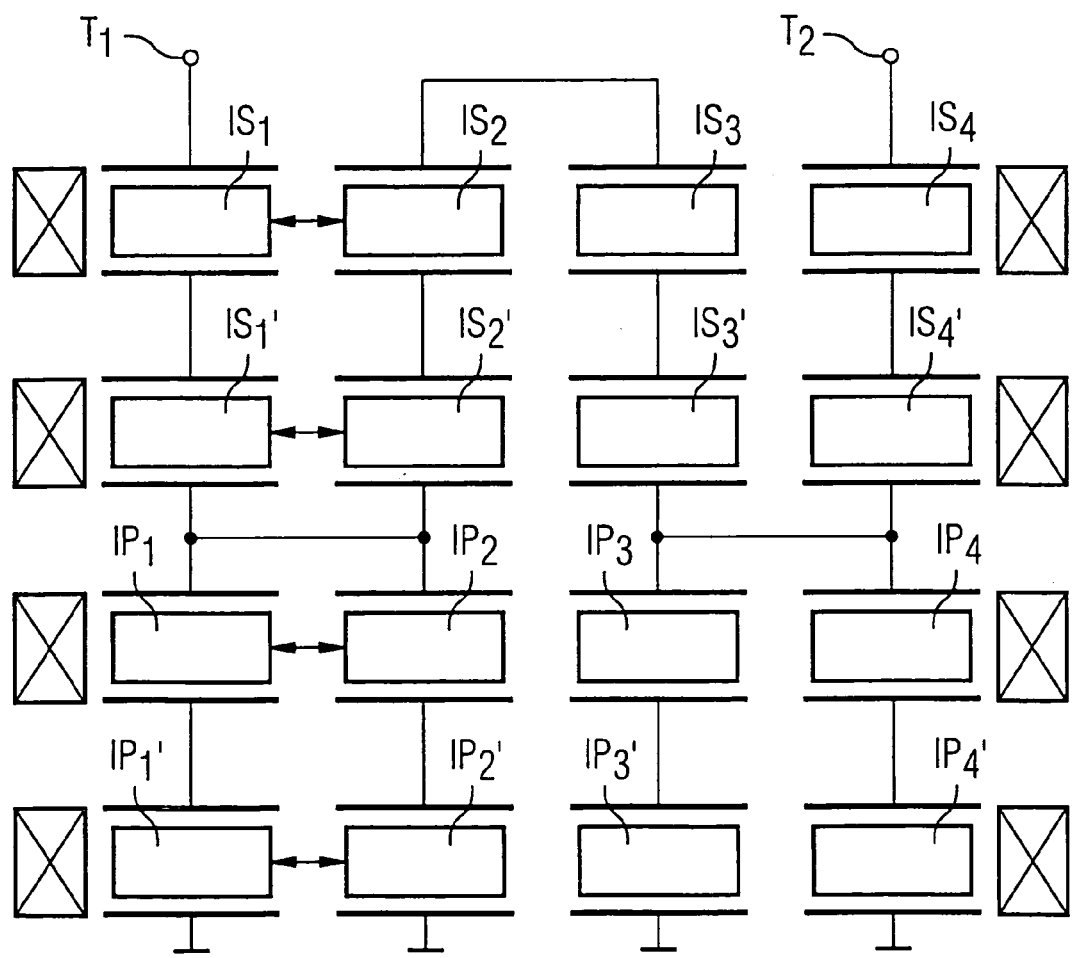
FIG. 21 shows the same arrangement, however with cascaded interdigital transducers.

FIG. 21 shows an arrangement corresponding to this in which, however, each of the serial and parallel interdigital transducers IS, IP is replaced by a two-fold cascade of interdigital transducers, respectively with doubled transducer surface, arranged next to one another transverse to the propagation direction of the acoustic wave. The interdigital transducers here exhibit the same aperture as in FIG. 20. The total arrangement now comprises only four acoustic tracks, whereby all interdigital transducers within a track are acoustically coupled. The arrangement possesses the same filter characteristics as that shown in FIG. 20; it can therefore replace it in a filter, however relative to it exhibits four times the power stability due to the four-fold transducer surface.

In a variation, only the interdigital transducers of respectively one type (serial IS or parallel IP) per track are coupled with one another.

Although, for reasons of clarity, the invention could only be explained and shown using a few exemplary embodiments, the invention is not limited to the shown exemplary embodiments. Variation possibilities result in particular via combination of the shown embodiments and via combination of the circuiting arrangements with different transitions between acoustically coupled interdigital transducers. In particular, not shown were acoustically coupled interdigital transducers with different finger periods, different metallization ratios, weighted interdigital transducers, interdigital transducers with varying finger period and coupled interdigital transducers with different numbers of electrode fingers, as well as various variants of reflectors between acoustically coupled transducers.

We claim:

1. A component operating with surface-proximal acoustic waves, said component comprising:
   at least three interdigital transducers being arranged on a surface of a piezoelectric substrate, said interdigital transducers being respectively provided with a first and a second electrical connection and being electrically circuited with one another via said first and second electrical connections, so that the interdigital transducers are selected from serial and parallel interdigital transducers;
   at least one serial interdigital transducer being arranged in at least one serial branch serving as a signal path, said at least one serial branch connecting an input and an output of the component and in which all elements contained therein are electrically connected in series;
   at least one parallel branch in which is arranged a parallel interdigital transducer being connected parallel thereto against a reference potential;
   at least one of the serial or parallel interdigital transducers being arranged in series with an additional interdigital transducer in a propagation direction of the acoustic wave, so that both interdigital transducers are acoustically coupled with one another, so that the transducers coupling with each other differ from each other by at least one of the following features selected from a group consisting of:
   a) the interdigital transducers possessing a different aperture,
   b) the interdigital transducers possessing a different pitch,
   c) the interdigital transducers belong to different branches of the component,
   d) of the interdigital transducers, at least one is arranged in the serial branch and the transducers being not directly electrically connected with one another,
   e) the interdigital transducers comprising a different number of interdigital electrode fingers,
   f) the interdigital transducers exhibiting a different metallization ratio, and
   g) the interdigital transducers being weighted and exhibiting a different weighting; and
   both coupled interdigital transducers being arranged in a serial branch.

2. A component according to claim 1, in which both coupled interdigital transducers are arranged in a same serial branch, and in that both terminal electrode fingers adjacent to one another of the coupled interdigital transducers are respectively connected with busbars of the interdigital transducers that exhibit a lowest potential difference relative to one another.

3. A component according to claim 1, in which one of a metallized delay line and a reflector structure is arranged between the two interdigital transducers.

4. A component according to claim 1, in which at least two serial interdigital transducers following in succession in a circuit in the serial branch are arranged next to one another transverse to a propagation direction of the acoustic surface wave and thus form a cascade, and in which one of said interdigital transducers is acoustically coupled with an additional interdigital transducer.

5. A component according to claim 1, in which two serial interdigital transducers are coupled that are not arranged one directly after the other in the series circuit, and between which in a circuit in the serial branch is arranged at least one further acoustically uncoupled interdigital transducer.

6. A component according to claim 1, in which the two acoustically coupled interdigital transducers are separated from one another via an acoustically transmissive intermediate reflector that comprises a number of a reflector strips, whereby n is a positive natural number with $1 \leq n \leq 100$.

7. A component according to claim 1, in which at least two serial interdigital transducers are provided and acoustically coupled with one another and in which at least two parallel branches are provided, each with a parallel interdigital transducer, so that both parallel interdigital transducers are acoustically coupled.

8. A component according to claim 1, in which in the serial branch a DMS structure is arranged that is acoustically coupled with at least one serial interdigital transducer.

9. A component according to claim 1, in which the finger period of the parallel interdigital transducers is larger than the finger period of the serial interdigital transducers.

10. A component according to claim 1, in which additional elements selected from one-port resonators and DMS tracks are connected serially to the serial interdigital transducers.

11. A component according to claim 1, in which at least one part of the electrical connections between the interdigital transducers, or between the interdigital transducers, input, output and between the interdigital transducers and the electrical ground are realized as discrete elements selected from a group consisting of capacitors, delay lines, resistors, inductors, bond wires, bumps and other suitable connection elements.

12. A component according to claim 1, in which, viewed over a length of the interdigital transducer and a reflector, at least one of the finger period and the metallization ratio varies within one of the interdigital transducer and the reflector.

13. A component according to claim 12, in which actual values for one of the metallization ratio and finger period vary maximally +/−3% around an average value.

14. A component according to claim 12, in which, viewed over the length of one of the interdigital transducer and the reflector, actual values for one of the metallization ratio and finger period correspond to the actual values of a periodically sampled continuous function.

15. A component according to claim 1, in which a phase shift exists or a different finger period is set between two adjacent elements within an acoustic track, said two adjacent elements being selected from an interdigital transducer and a reflector, whereby the transition between the two adjacent elements is quasi-periodic.

16. A component according to claim 1, in which a connection sequence of the electrode fingers to an interdigital transducer is irregularly alternating and the interdigital transducer exhibits a withdrawal weighting.

17. A component according to claim 1, in which a position of a transversal gap in one type of interdigital transducer varies viewed over a length of the interdigital transducer.

18. A component according to claim 1, in which a size of a transversal gap in one type of interdigital transducer varies viewed over a length of the interdigital transducer.

19. A component according to claim 18, wherein a height g of the transversal gaps is $g \leq \lambda/4$.

20. A component according to claim 1, in which the interdigital transducers respectively belong to resonators that respectively exhibit a resonance frequency and an anti-resonance frequency, whereby the resonance frequency of the serial interdigital transducers lies in a range of the anti-resonance frequency of the parallel interdigital transducer or slightly above it.

21. A component according to claim 1, in which the serial interdigital transducers are detuned against one another.

22. A component according to claim 1, in which all apertures and overlappings of the electrode fingers are equal within an acoustic track.

23. A component according to claim 1, which includes a piezoelectric substrate that exhibits a surface aligned to crystal axes via suitable cut angles, said substrate being known for low losses given surface waves, Raleigh waves, shear waves, leak waves, BGS waves and HPVSAW.

24. A component according to claim 23, in which the piezoelectric substrate comprises one of the materials selected from a group consisting of $LiTaO_3$, $LiNbO_3$, quartz, langasite, langatate, $GaBO_4$, $Li_2B_4O_7$, langanite, $KnbO_3$ and GaAs.

25. A component according to claim 23, in which the piezoelectric substrate comprises a piezoelectric film that is applied on a carrier substrate.

26. A component according to claim 25, in which the piezoelectric film is selected from a group consisting of $LiTaO_3$, $LiNbO_3$, AlN, ZnO and GaAs.

27. A component according to claim 1, in which the interdigital transducers, and the electrical connections connecting them in circuit are fashioned as metallic structures and are comprised of a material selected from a group consisting of aluminum, an aluminum alloy and multilayer structures, whereby individual layers of the multilayer structure comprise at least one layer made from a material selected from a group consisting of aluminum, an aluminum alloy, Cu, Zr, Mg, Ti and Sc.

28. A component according to claim 27, in which a layer thicknesses h of the metallic structures are selected in the range of $1\% < h/\lambda < 15\%$.

29. A component according to claim 27, in which passivation layers are provided over the metallic structures.

30. A component according to claim 1, wherein the reference potential to which the at least one parallel branch is connected is a free-floating internal reference potential.

31. A component operating with surface-proximal acoustic waves, said component comprising:

at least three interdigital transducers being arranged on a surface of a piezoelectric substrate, said interdigital transducers being respectively provided with a first and a second electrical connection and being electrically circuited with one another via said first and second electrical connections, so that the interdigital transducers are selected from serial and parallel interdigital transducers;

at least one serial interdigital transducer being arranged in at least one serial branch serving as a signal path, said branch connecting an input and an output of the component and in which all elements contained therein are electrically connected in series;

at least one parallel branch in which is arranged a parallel interdigital transducer being connected parallel thereto against a reference potential;

at least one of the serial or parallel interdigital transducers being arranged in series with an additional interdigital transducer in a propagation direction of the acoustic wave, so that both interdigital transducers are acoustically coupled with one another, so that the transducers coupling with each other differ from each other by at least one of the following features selected from a group consisting of:
  a) the interdigital transducers possessing a different aperture,
  b) the interdigital transducers possessing a different pitch,
  c) the interdigital transducers belong to different branches of the component,
  d) of the interdigital transducers, at least one is arranged in the serial branch and the transducers being not directly electrically connected with one another,
  e) the interdigital transducers comprising a different number of interdigital electrode fingers,
  f) the interdigital transducers exhibiting a different metallization ratio, and
  g) the interdigital transducers being weighted and exhibiting a different weighting;

at least two serial interdigital transducers following in succession in circuit in the serial branch are arranged next to one another transverse to the propagation direction of the acoustic surface wave to form a first electrical cascade;

another at least two interdigital transducers following in succession in circuit in the serial branch or in the parallel branch and arranged next to one another to form a second electrical cascade;

two of the interdigital transducers coupled to one another are in a same cascade; and the interdigital transducers of the first electrical cascade being acoustically coupled with corresponding ones of the interdigital transducers of the second cascade.

32. A component operating with surface-proximal acoustic waves, said component comprising:

at least three interdigital transducers being arranged on a surface of a piezoelectric substrate, said interdigital transducers being respectively provided with a first and a second electrical connection and being electrically circuited with one another via said first and second electrical connections, so that the interdigital transducers are selected from serial and parallel interdigital transducers;

at least one serial interdigital transducer being arranged in at least one serial branch serving as a signal path, said branch connecting an input and an output of the component and in which all elements contained therein are electrically connected in series;

at least one parallel branch in which is arranged a parallel interdigital transducer being connected parallel thereto against a reference potential;

at least one of the serial or parallel interdigital transducers being arranged in series with an additional interdigital transducer in a propagation direction of the acoustic wave, so that both interdigital transducers are acoustically coupled with one another, so that the transducers coupling with each other differ from each other by at least one of the following features selected from a group consisting of:
   a) the interdigital transducers possessing a different aperture,
   b) the interdigital transducers possessing a different pitch,
   c) the interdigital transducers belong to different branches of the component,
   d) of the interdigital transducers, at least one is arranged in the serial branch and the transducers being not directly electrically connected with one another,
   e) the interdigital transducers comprising a different number of interdigital electrode fingers,
   f) the interdigital transducers exhibiting a different metallization ratio, and
   g) the interdigital transducers being weighted and exhibiting a different weighting; and
at least three serial interdigital transducers arranged next to one another are part of a cascade, in which the three interdigital transducers are acoustically coupled, in which both outer interdigital transducers are circuited parallel to one another and respectively in series relative to a center interdigital transducer of the three interdigital transducers.

33. A component operating with surface-proximal acoustic waves, said component comprising:
   at least three interdigital transducers being arranged on a surface of a piezoelectric substrate, said interdigital transducers being respectively provided with a first and a second electrical connection and being electrically circuited with one another via said first and second electrical connections, so that the interdigital transducers are selected from serial and parallel interdigital transducers;
   at least one serial interdigital transducer being arranged in at least one serial branch serving as a signal path, said branch connecting an input and an output of the component and in which all elements contained therein are electrically connected in series;
   at least one parallel branch in which is arranged a parallel interdigital transducer being connected parallel thereto against a reference potential;
   at least one of the serial or parallel interdigital transducers being arranged in series with an additional interdigital transducer in a propagation direction of the acoustic wave, so that both interdigital transducers are acoustically coupled with one another, so that the transducers coupling with each other differ from each other by at least one of the following features selected from a group consisting of:
   a) the interdigital transducers possessing a different aperture,
   b) the interdigital transducers possessing a different pitch,
   c) the interdigital transducers belong to different branches of the component,
   d) of the interdigital transducers, at least one is arranged in the serial branch and the transducers being not directly electrically connected with one another,
   e) the interdigital transducers comprising a different number of interdigital electrode fingers,
   f) the interdigital transducers exhibiting a different metallization ratio, and
   g) the interdigital transducers being weighted and exhibiting a different weighting; and
   two parallel interdigital transducers are provided that are part of a DMS filter.

34. A component operating with surface-proximal acoustic waves, said component comprising:
   at least three interdigital transducers being arranged on a surface of a piezoelectric substrate, said interdigital transducers being respectively provided with a first and a second electrical connection and being electrically circuited with one another via said first and second electrical connections, so that the interdigital transducers are selected from serial and parallel interdigital transducers;
   at least one serial interdigital transducer being arranged in at least one serial branch serving as a signal path, said branch connecting an input and an output of the component and in which all elements contained therein are electrically connected in series;
   at least one parallel branch in which is arranged a parallel interdigital transducer being connected parallel thereto against a reference potential;
   at least one of the serial or parallel interdigital transducers being arranged in series with an additional interdigital transducer in a propagation direction of the acoustic wave, so that both interdigital transducers are acoustically coupled with one another, so that the transducers coupling with each other differ from each other by at least one of the following features selected from a group consisting of:
   a) the interdigital transducers possessing a different aperture,
   b) the interdigital transducers possessing a different pitch,
   c) the interdigital transducers belong to different branches of the component,
   d) of the interdigital transducers, at least one is arranged in the serial branch and the transducers being not directly electrically connected with one another,
   e) the interdigital transducers comprising a different number of interdigital electrode fingers,
   f) the interdigital transducers exhibiting a different metallization ratio, and
   g) the interdigital transducers being weighted and exhibiting a different weighting; and
   all serial interdigital transducers are arranged in a common serial track and all parallel interdigital transducers are arranged in a common parallel track.

35. A component according to claim 34, in which an aperture of the parallel track is larger than an aperture of the serial track.

36. A component according to claim 35, in which the aperture of the serial track is at least $15\lambda$ large, whereby $\lambda$ is an acoustic wavelength at a center frequency of the component.

37. A component operating with surface-proximal acoustic waves, said component comprising:
   at least three interdigital transducers being arranged on a surface of a piezoelectric substrate, said interdigital transducers being respectively provided with a first and a second electrical connection and being electrically circuited with one another via said first and second electrical connections, so that the interdigital transducers are selected from serial and parallel interdigital transducers;

at least one serial interdigital transducer being arranged in at least one serial branch serving as a signal path, said branch connecting an input and an output of the component and in which all elements contained therein are electrically connected in series;

at least one parallel branch in which is arranged a parallel interdigital transducer being connected parallel thereto against a reference potential;

at least one of the serial or parallel interdigital transducers being arranged in series with an additional interdigital transducer in the propagation direction of the acoustic wave, so that both interdigital transducers are acoustically coupled with one another, so that the transducers coupling with each other differ from each other by at least one of the following features selected from a group consisting of:

a) the interdigital transducers possessing a different aperture, b) the interdigital transducers possessing a different pitch, c) the interdigital transducers belong to different branches of the component, d) of the interdigital transducers, at least one is arranged in the serial branch and the transducers being not directly electrically connected with one another, e) the interdigital transducers comprising a different number of interdigital electrode fingers, f) the interdigital transducers exhibiting a different metallization ratio, and g) the interdigital transducers being weighted and exhibiting a different weighting; and the two interdigital transducers acoustically coupled with one another exhibit a same finger period, however are displaced against each other by an amount $\Delta x$, with $-0.25<\Delta x/\lambda<0.25$, whereby $\lambda$ is an acoustic wavelength at a center frequency of the component.

38. A component operating with surface-proximal acoustic waves, said component comprising:

at least three interdigital transducers being arranged on a surface of a piezoelectric substrate, said interdigital transducers being respectively provided with a first and a second electrical connection and being electrically circuited with one another via said first and second electrical connections, so that the interdigital transducers are selected from serial and parallel interdigital transducers;

at least one serial interdigital transducer being arranged in at least one serial branch serving as a signal path, said branch connecting an input and an output of the component and in which all elements contained therein are electrically connected in series;

at least one parallel branch in which is arranged a parallel interdigital transducer being connected parallel thereto against a reference potential;

at least one of the serial or parallel interdigital transducers being arranged in series with an additional interdigital transducer in a propagation direction of the acoustic wave, so that both interdigital transducers are acoustically coupled with one another, so that the transducers coupling with each other differ from each other by at least one of the following features selected from a group consisting of:

a) the interdigital transducers possessing a different aperture, b) the interdigital transducers possessing a different pitch, c) the interdigital transducers belong to different branches of the component, d) of the interdigital transducers, at least one is arranged in the serial branch and the transducers being not directly electrically connected with one another, e) the interdigital transducers comprising a different number of interdigital electrode fingers, f) the interdigital transducers exhibiting a different metallization ratio, and g) the interdigital transducers being weighted and exhibiting a different weighting; and additional elements selected from one-port resonators and DMS tracks are connected serially to the parallel interdigital transducers.

39. A component operating with surface-proximal acoustic waves, said component comprising:

at least three interdigital transducers being arranged on surface of a piezoelectric substrate, said interdigital transducers being respectively provided with a first and a second electrical connection and being electrically circuited with one another via said first and second electrical connections, so that the interdigital transducers are selected from serial and parallel interdigital transducers;

at least one serial interdigital transducer being arranged in at least one serial branch serving as a signal path, said branch connecting the input and the output of the component and in which all elements contained therein are electrically connected in series;

at least one parallel branch in which is arranged a parallel interdigital transducer being connected parallel thereto against a reference potential;

at least one of the serial or parallel interdigital transducers being arranged in series with an additional interdigital transducer in a propagation direction of the acoustic wave, so that both interdigital transducers are acoustically coupled with one another, so that the transducers coupling with each other differ from each other by at least one of the following features selected from a group consisting of:

a) the interdigital transducers possessing a different aperture, b) the interdigital transducers possessing a different pitch, c) the interdigital transducers belong to different branches of the component, d) of the interdigital transducers, at least one is arranged in the serial branch and the transducers being not directly electrically connected with one another, e) the interdigital transducers comprising a different number of interdigital electrode fingers, f) the interdigital transducers exhibiting a different metallization ratio, and g) the interdigital transducers being weighted and exhibiting a different weighting; and both coupled interdigital transducers being arranged in a parallel branch.

40. A component according to claim 39, in which the parallel interdigital transducers are detuned against one another.

* * * * *